(12) United States Patent
Sunkavalli et al.

(10) Patent No.: US 8,902,631 B2
(45) Date of Patent: Dec. 2, 2014

(54) MEMORY DEVICES, CIRCUITS AND, METHODS THAT APPLY DIFFERENT ELECTRICAL CONDITIONS IN ACCESS OPERATIONS

(75) Inventors: Ravi Sunkavalli, Cupertino, CA (US); Ishai Naveh, San Jose, CA (US); Malcolm Wing, Palo Alto, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 248 days.

(21) Appl. No.: 13/600,161

(22) Filed: Aug. 30, 2012

(65) Prior Publication Data

US 2014/0063902 A1    Mar. 6, 2014

(51) Int. Cl.
*G11C 11/00*    (2006.01)
(52) U.S. Cl.
USPC ................. 365/148; 365/200; 365/185.18

(58) Field of Classification Search
USPC ............. 365/148, 230.03, 200, 185.18
See application file for complete search history.

(56) References Cited

U.S. PATENT DOCUMENTS 8,094,500 B2 *    1/2012    Paley et al. ............ 365/185.12

* cited by examiner

*Primary Examiner* — Son Dinh

(57) ABSTRACT

A memory device can include a plurality of physical blocks that each include a number of memory elements programmable between at least two different impedance states, the memory elements being subject to degradation in performance; and bias circuits configured to applying healing electrical conditions to at least one spare physical block that does not contain valid data; wherein the healing electrical conditions are different from write operation electrical conditions, and reverse degradation of the memory elements of the at least one spare physical block.

20 Claims, 13 Drawing Sheets

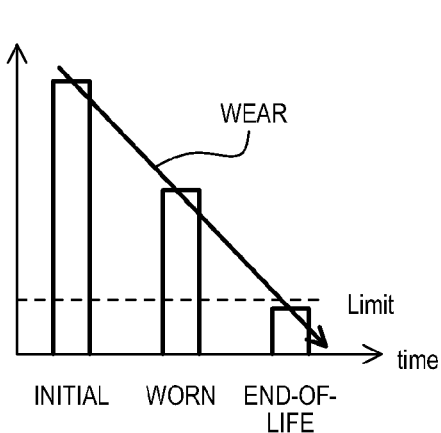
FIG. 2A
(CONVENTIONAL)

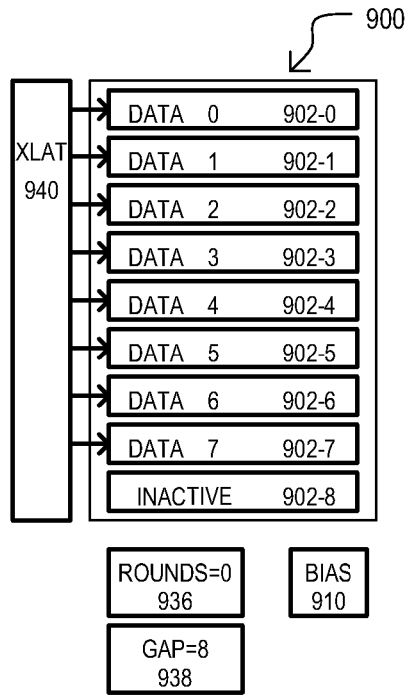
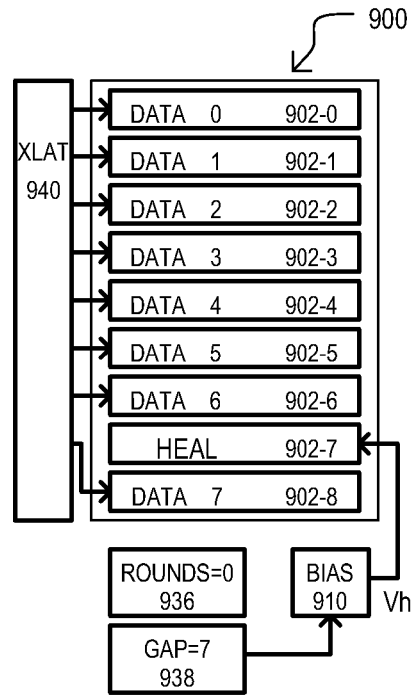
FIG. 9A
FIG. 9B
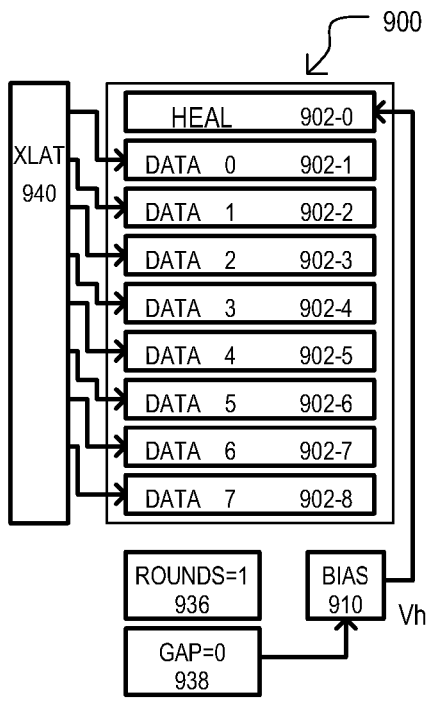
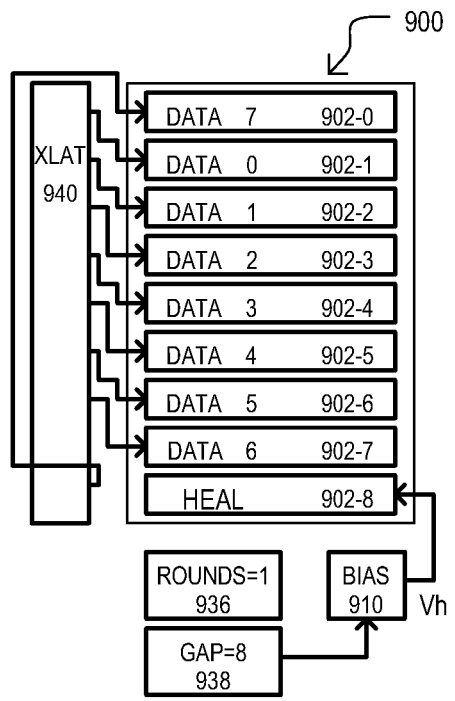
FIG. 9C
FIG. 9D

MEMORY DEVICES, CIRCUITS AND, METHODS THAT APPLY DIFFERENT ELECTRICAL CONDITIONS IN ACCESS OPERATIONS

TECHNICAL FIELD

The present disclosure relates generally to memory devices, and more particularly to memory devices having elements programmable between two or more impedance states.

BACKGROUND

Conventional conductive bridging random access memory (CBRAMs) devices can include memory elements programmable between different resistance levels. "Fresh" CBRAM devices (i.e., those which have just been manufactured) can be subject to an initial "forming" step, placing the memory elements into an initial state, which provides for good write performance.

However, as elements are repeatedly programmed and erased (e.g., subject to write operations), memory elements can degrade in performance, suffering from shorter data retention times and/or unacceptable write responses (e.g., resistance values are not within a desired range).

BRIEF DESCRIPTION OF THE DRAWINGS

FIGS. 2A to 2D are graphs showing healing operations according to embodiments.

FIGS. 9A to 9D are block schematic diagrams of a memory device that can periodically remap addresses to initiate heal conditions on spare blocks, according to an embodiment.

DETAILED DESCRIPTION

Figure 1A:
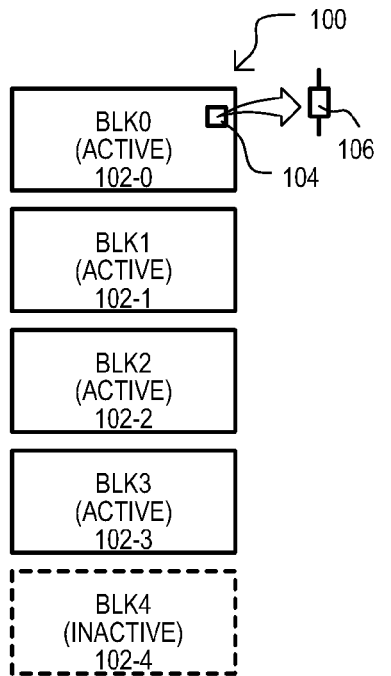
FIGS. 1A to 1C are block diagrams of a memory device and operations according to embodiments.

Embodiments disclosed herein show memory devices and methods that can include one or more spare groups of memory cells to enable one group of memory cells to be "healed" while other groups are active (e.g., available for read and/or write operations). Healing can reverse degradation of memory elements that can occur over time.

In the embodiments below, like sections are referred to by the same reference character but with the leading digit(s) corresponding to the figure number.

Figure 1B:
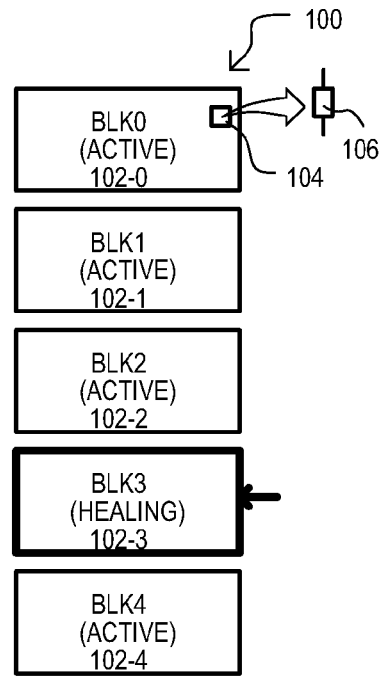
Figure 1C:
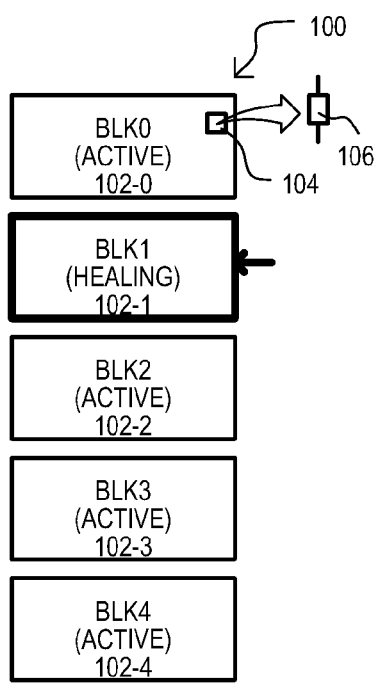

Referring to FIGS. 1A to 1C, a memory device 100 according to one embodiment is shown in a sequence of block schematic diagrams. A memory device 100 can include a number of blocks 102-0 to -4, each including a number of memory cells (one shown as 104). Each memory cell (e.g., 104) can include one or more memory elements (one shown as 106). Blocks (102-0 to -4) can store data values by programming elements (e.g., 104) between two or more impedance states. Blocks (102-0 to -4) can represent a logical and/or physical division of the memory cells included in a memory device 100. It is understood that such a division can occur along various lines. In some embodiments, a "block" can include multiple rows and columns of memory cells. In other embodiments, a "block" can include one or more rows or one or more columns of memory cells.

A memory element 106 can take various forms, but in particular embodiments can be a two terminal element that includes one or more memory materials formed between two electrodes. By application of an electric field, the element 106 can be programmed between two or more impedance states. An impedance state can be static or dynamic. In a static case, in response to the application of sense (e.g., read) conditions, an impedance of an element can remain substantially the same. However, in the dynamic case, at least one of the impedance states changes in response to the sense conditions.

In some embodiments, a memory element can be a conductive bridging random access memory (CBRAM) type element, in which conductive regions (e.g., filaments) can be formed and dissolved within a solid electrolyte, or other material, by application of different electric fields. In very particular embodiments, a memory material of an element can include a chalcogenide and/or a metal oxide.

Referring now to FIG. 1A, in operation, some memory blocks of the memory device 100 can be active blocks, allowing data can be read from or written to locations within the block. However, at the same time, one or more other blocks can be spare blocks. In the particular embodiment shown, initially, blocks 102-0 to -3 can be active blocks, while block 102-4 can be a spare block.

As the memory device 100 continues to operate in the configuration shown, allowing accesses to blocks 102-0 to -3, a response of memory elements (e.g., 106) can start to degrade (i.e., be subject to wear). Degradation can vary according to type of memory element, and in particular embodiments, can result from write operations and/or the passage of time.

Referring to FIG. 1B, eventually, a block can be determined to be worn. In such an event, a spare block and a worn active block can be switched. The previously active block (now a spare block) can be subjected to a "healing" operation. In FIG. 1B, spare block 102-4 can be switched for active block 102-3. The (now) spare block 102-3 can be subject to a healing operation. A healing operation can reverse the wear of the elements, improving their response.

Referring to FIG. 1C, eventually, another block can be determined to be worn. In such an event, the worn block can be switched with a (healed) spare block. The worn active block (now a spare block) can be subjected to the "healing" operation. In FIG. 1C, healed block 102-3 can be switched for active block 102-1. The (now) spare block 102-1 can be subject to a healing operation.

Such operations can continue, substituting worn blocks with healed blocks, and then healing the worn blocks for use once again.

FIGS. 2A to 2D are graphs for depicting heal operations according to various embodiments.

FIG. 2A is a graph showing a conventional memory device operation. A Y-axis can represent a wear level for a block containing memory elements that can be subject to wear. A wear level can correspond to a performance of memory cells in a block. Such performance can vary according to memory element type, and can include, but is not limited to: impedance range (i.e., limits to which element can be programmed); data retention time; response speed (i.e., how fast value can read from an element); or a time required to write one or more values. An X-axis can show the device performance over time.

As shown in FIG. 2A, initially (shown by INITIAL), a memory device can have no wear. In some cases, a memory device can be subject to an initial "forming" step, which applies electrical conditions to memory elements to establish an initial state.

Referring still to FIG. 2A, as the memory device is operated, a block of memory cells can begin to wear (shown by WORN). Eventually, such wear can fall below a predetermined limit (Limit), resulting in a device reaching its end-of-life (EOL). This degradation in performance is shown by a line WEAR.

Figure 2B:
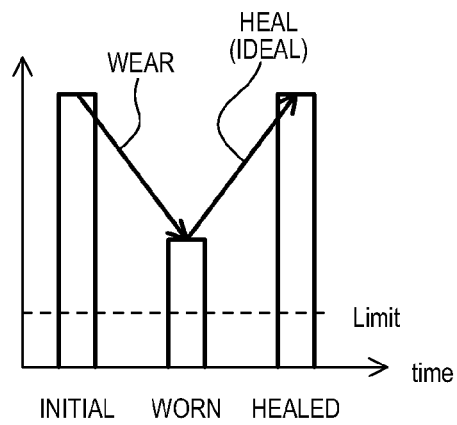

FIG. 2B is a graph showing a heal operation for a memory device, according to an embodiment. FIG. 2B has the same axes and wear limits as FIG. 2A.

As in the case of FIG. 2A, in FIG. 2B, in an INITIAL state, a memory device has no wear. Due to operations, (show by line WEAR), the block of memory cells can begin to wear (shown by WORN). However, after a heal operation (shown by line HEAL), a wear level can be returned to a high level. FIG. 2B shows a result of an ideal healing operation, in which a wear level can be returned to an initial state.

Figure 2C:
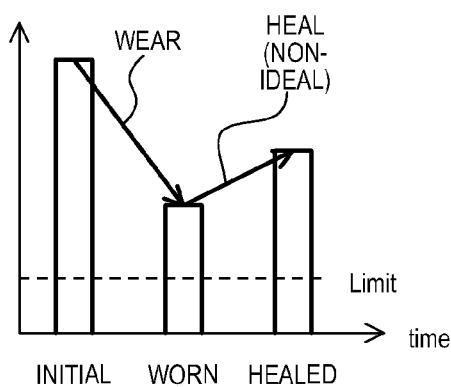

FIG. 2C is a graph showing a heal operation according to another embodiment. FIG. 2C shows a heal operation like that of FIG. 2B, however, the heal operation is non-ideal. The non-ideal heal operation improves a wear level for a block of memory cells, but to not as high a level as the initial state.

In some embodiments, only non-ideal healing occurs, as ideal healing may not be possible due to the type of memory element used. In other embodiments, only non-ideal healing occurs as the amount of time or the complexity involved to accomplish ideal healing (or some other higher level of healing) is impractical, given a device's performance requirement, application, operating limits, etc.

Figure 2D:
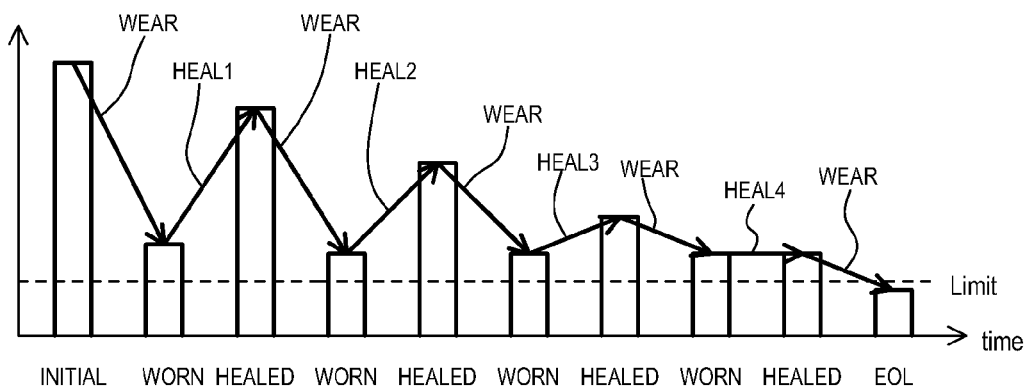

FIG. 2D is a graph showing a sequence of heal operations that can extend an operating life of a device. As shown, each time a block of memory cells reaches a certain wear level, a healing operation can be performed. As shown, however, each heal operations can have diminishing returns. However, as compared to the conventional operation shown in FIG. 2A, a lifetime of a device can be substantially extended.

It is understood that while FIGS. 2A to 2D show wear effects that appear linear, wear effects can be non-linear. Further, in a memory device, healing as shown in FIGS. 2B to 2D can occur continuously on different blocks as wear levels reach limits. It is also noted that healing can occur in serial fashion, one block at a time, or can occur in parallel, on multiple blocks at the same time.

Figure 3A:
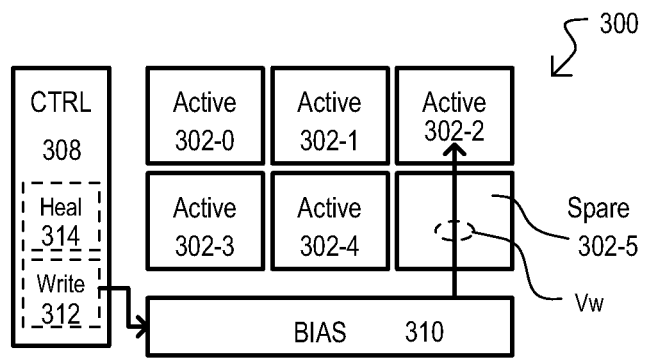
FIGS. 3A to 3C are block diagrams of a memory device and operations according to additional embodiments.
Figure 3B:
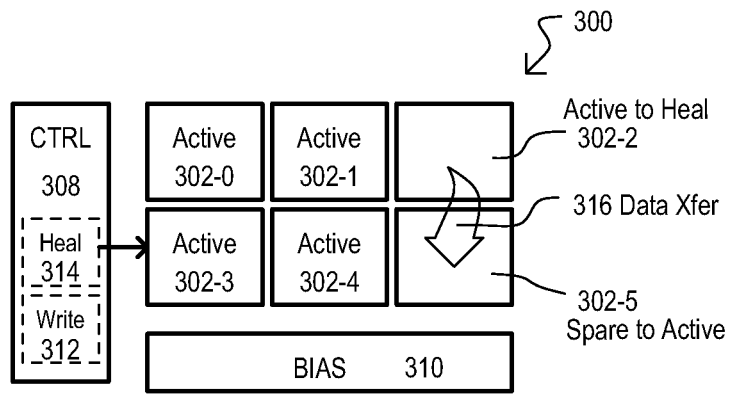
Figure 3C:
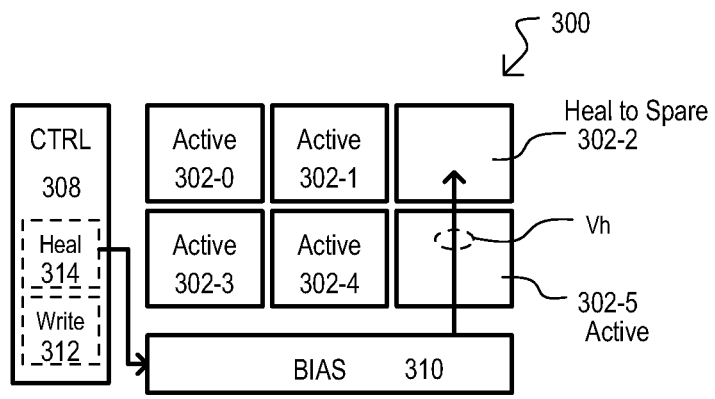

Referring to FIGS. 3A to 3C, a memory device 300 according to another embodiment is shown in a sequence of block schematic diagrams. A memory device 300 can include a number of blocks 302-0 to -5, a control section 308, and a bias section 310. Blocks (302-0 to -5) can include memory cells including one or more elements that can be subject to wear, as described herein or equivalents. In the very particular embodiment shown, five of six blocks can be active blocks while one block can be a spare block.

A control section 308 can control accesses to blocks (302-0 to -5), and in addition, can provide control signals to bias section 310 to enable different electrical conditions to be applied to the blocks (302-0 to -5) according to a given operation. In the embodiment shown, control section 308 can include a write section 312 and a heal section 314.

A write section 312 can include control circuits to control write operations to a block (302-0 to -5). In some embodiments, a write section 312 can generate signals that can work in combination with address values to access a group of memory cells within a block, and indicate bias values to be applied such memory cells. A write section 312 can also control how electrical conditions are applied (e.g., sequencing pulses, etc.)

A heal section 314 can include control circuits to control heal operations to a block (302-0 to -5). In some embodiments, a heal section 314 can include circuits that generate or receive wear indications for various blocks (302-0 to -5), as well as storage circuits that indicate which blocks are active, and which block(s) is a spare block. In response to such wear indications, a heal section 314 can generate signals that can control a transfer of data between blocks, as well as control signals that indicate bias values to be applied to a block in a heal operation.

A write section 312 and/or heal section 314 can include, but are not limited to: custom logic circuits configured to generate control signals in response to a received command, instructions executable by a processor, or combinations thereof. Further, a write section 312 and heal section 314 can share circuits and/or other control features (e.g., subroutines, etc.).

A bias section 310 can apply electrical conditions to memory cells of a block (302-0 to -5) for various access operations. In the particular embodiment shown, a bias section 310 can generate bias conditions to write data into memory cells of a block (302-0 to -5), and bias conditions to heal memory cells of a block (302-0 to -5).

FIG. 3A shows a write operation according to an embodiment. In FIG. 3A it is assumed that blocks 302-0 to -4 are active blocks, and block 302-5 is a spare block. In response to a request (WR), a write section 312 can generate control signals that enable access to memory cells within block 302-2. In addition, write section 312 can generate control signals that result in bias section 310 applying electrical write conditions (shown as Vw) to memory cells within block 302-2. According to some embodiments, write operations can write different data values (e.g., 1s and 0s) in a same access operation. In addition or alternatively, a write operation can be a two-step operation, writing one data value to all memory cells in an accessed group (which can be the whole block) and then selectively writing another data value based on received write data.

FIG. 3B shows one portion of heal operation according to an embodiment. In FIG. 3B it is assumed that block 302-2 is determined to be worn, and so will be subject to a healing operation. In some embodiments, execution of healing operation can be automatic. That is, a memory device 300 can execute heal operations itself, based on wear data. In very particular embodiments, a memory device 300 can execute heal operations in the "background", invisible to other devices issuing commands to the memory device 300. In addition or alternatively, heal operations can be initiated by inputs to memory device 300 by some other device.

Referring still to FIG. 3B, in a heal operation, a heal section 314 can generate control signals that result in the transfer of data from the worn block (i.e., block 302-2) to the spare block (i.e., 302-5). Such a data transfer is shown as 316 in FIG. 3B.

FIG. 3C shows another portion of a heal operation according to an embodiment. Following a transfer of data from a worn block to a spare block, healing electrical conditions can be applied to the worn block. In the embodiment shown, a heal section 314 can generate control signals that result in bias section 310 applying healing electrical conditions to the worn block 302-2 (shown as Vh).

Referring to FIGS. 3A to 3C once more, in some embodiments write electrical conditions (Vw) can be different than healing electrical conditions (Vh). As but a few examples, a voltage and/or current amplitude can be different; a duration of applied voltages/currents can be different, or a number of iterations or types of iterations can be different.

In very particular embodiments, healing electrical conditions can include iterations of applying healing electrical conditions followed by memory cell compliance checks.

Figure 4:
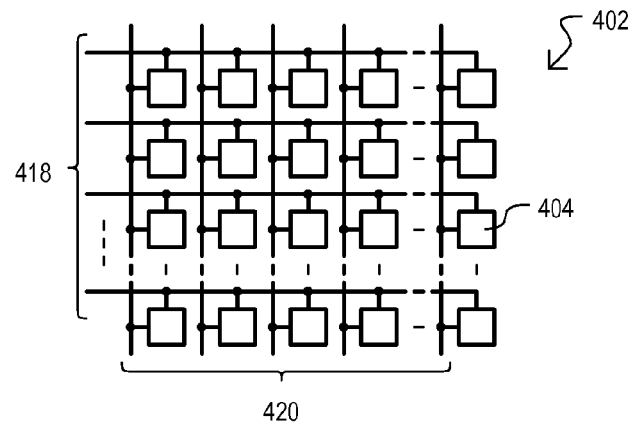
FIG. 4 is a block schematic diagram of a memory block that can be included in embodiments.

Referring to FIG. 4, a block 402 that can be included in embodiments is shown in a block schematic diagram. A block 402 can include a number of memory cells (one shown as 404) arranged into rows and columns. Word lines 418 can be connected to memory cells of a same row, and bit line 420 can be connected to memory cells of a same column.

It is understood that while the block 402 of FIG. 4 includes multiple rows and columns, in some embodiments, a block 402 can include multiple arrays. Further, in other embodiments a block 402 can include as few as one row of memory cells. Along these same lines, accesses to a block 402 can have various bit widths, including but not limited to: a nibble, byte, word, double-word, or page.

Referring to FIGS. 5A to 5D, memory cells that can be included in embodiments are shown in schematic diagrams.

Figure 5A:
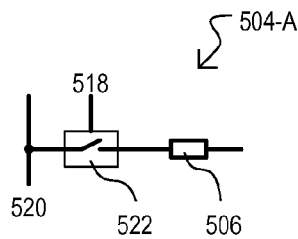
FIGS. 5A to 5D are schematic diagrams of memory cells that can be included in embodiments.

FIG. 5A shows a memory cell 504-A which can include an access device 522 and a memory element 506. An access device 522 can enable or disable a conductive path between a bit line 520 and memory element 506 in response to a signal on word line 518. An access device 522 can include any suitable active device, including any of various transistors.

Figure 5B:
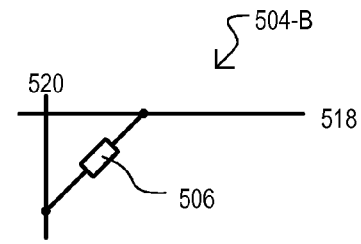

FIG. 5B shows a memory cell 504-B that can include a memory element 506 connected in a cross-point array type fashion between bit line 520 and a row line 520.

Figure 5C:
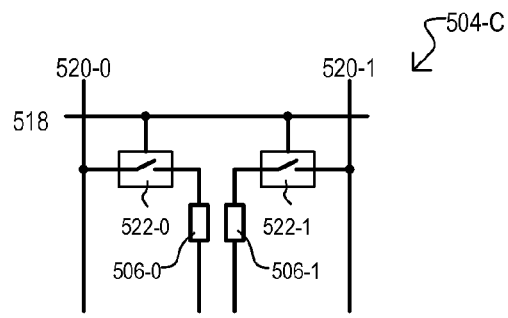

FIG. 5C shows a differential type memory cell 504-C that can include access devices 522-0/1 and memory elements 506-0/1. Access devices 522-0/1 can enable or disable a conductive path between their corresponding memory element 506-0/1 and bit lines 520-0/1 in response to a signal on word line 518.

Figure 5D:
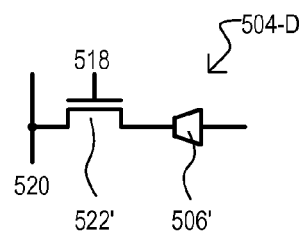

FIG. 5D shows a memory cell 504-D according to a further embodiment. A memory cell 504-D can be one particular variation of that show in FIG. 5A. Memory cell 504-D can differ from that of FIG. 5A in that an access device 522' can be an insulated gate (MOS) type field effect transistor, in particular an n-channel MOS type transistor. A memory element 506' can be a CBRAM type element.

As noted above, memory devices according to embodiments can execute heal operations based on wear data for a group of memory cells. Examples of such embodiments are shown in FIGS. 6A to 7.

Figure 6A:
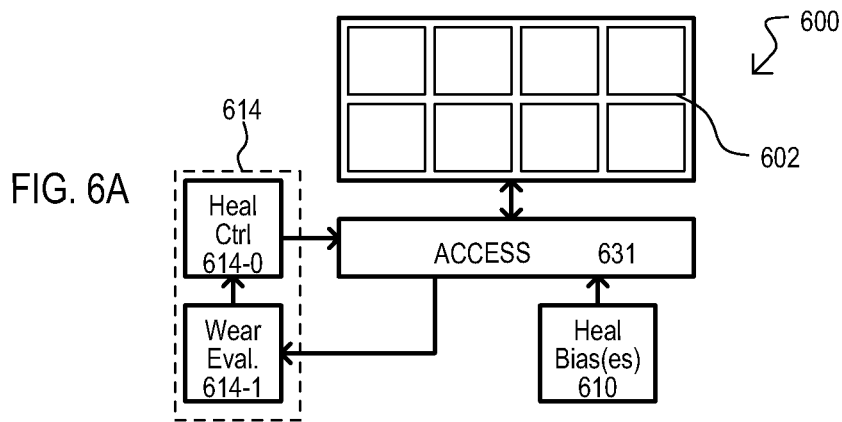
FIGS. 6A and 6B are block schematic diagrams of a memory device and heal section that can initiate heal operations based on wear levels of blocks, according to embodiments.
Figure 7:
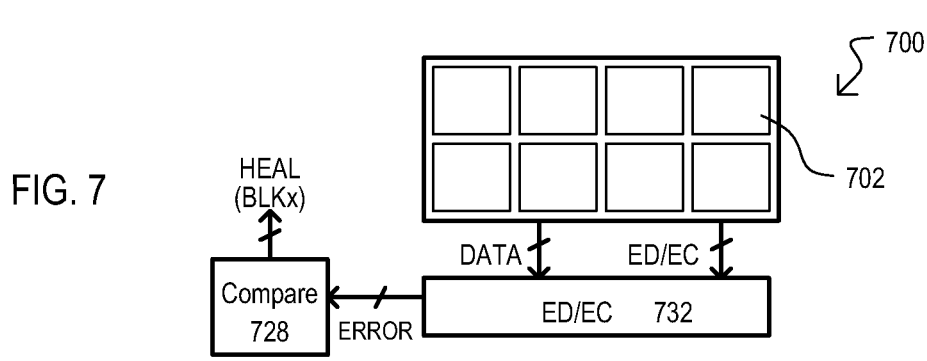
FIG. 7 is a block schematic diagram of a memory device that initiates heal operations based on error levels of blocks, according to an embodiment.

Referring to FIG. 6A, a memory device 600 can include a number or blocks (one shown as 602), an access circuit 631, a heal circuit 614, and heal bias source 610. An access circuit 631 can enable access to blocks (e.g., 602) in various operations, including heal operations.

A heal circuit 614 can include a heal controller 614-0 and a wear evaluator 614-1. In operation, a heal controller 614-0 can enable paths between blocks (e.g., 602) and wear evaluator 614-1, via access circuit 631. A wear evaluator 614-1 can determine, according to properties of memory cells in a bank, weather such a bank is determined to be worn. If a bank is determined to be worn, heal controller 614-0 can enable paths between blocks (e.g., 602) and heal bias source 610. Heal bias source 610 can apply one or more healing bias conditions to the worn block.

It is understood that a wear evaluator 614-1 can make a wear determination using any suitable technique, including but not limited to: analog evaluation of one or more elements within a block, current performance of memory cells within a block and/or past performance of memory cells within the block.

Figure 6B:
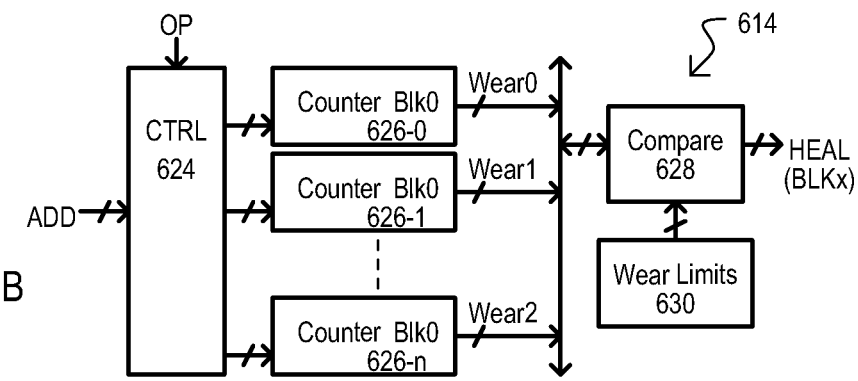

FIG. 6B is a block schematic diagram of a heal section 614 according to one particular embodiment. A heal section 614 can initiate heal operations on a block based on a count value corresponding to operations performed on the block. In the embodiment shown, a heal section 614 can include an operation detect circuit 624, block count stores 626-0 to -n, a compare circuit 628, and wear limit source 630. An operation detect circuit 624 can detect when operations are executed on a given block, such as a write operations and/or read operations. In the particular embodiment shown, a detect circuit 624 can receive an operation value (OP) and an address value, and in response, update values in block count stores (626-0 to -n). Values within block count stores (626-0 to -n) can thus reflect use of a block, and hence its wear level. In some embodiments, wear counts can be based strictly on one or more different types of operation. However, in other embodiments wear levels can be weighted based on type of operation (e.g., some writes can count more than other writes and/or writes can count more than reads).

A compare circuit 628 can compare wear values (Wear0 to Wearn) to wear limits provided by a wear limit source 630. In response to such a comparison, a compare circuit 628 can activate control signals (HEAL (BLKx)) to initiate a heal operation on particular blocks.

FIG. 7 is a block schematic diagram of a memory device 700 according to another embodiment. A memory device 700 can initiate heal operations based on error rates of data read from a block. A memory device 700 can include a number of blocks (one shown as 702), an error detect/correct (ED/EC) circuit 732, and a compare circuit 728. Blocks (e.g., 702) can include memory cells including one or more elements that can be subject to wear, as described herein or equivalents.

Blocks (e.g., 702) can include active blocks and one or more spare blocks. In addition, blocks (e.g., 702) can store data values (DATA) along with error detection (ED) or error correction (EC) codes for such data values.

ED/EC circuit 732 can receive data values (DATA) and a corresponding code (ED/EC), and perform an error detection and/or correction operation, if needed. Upon detecting an error, an ED/EC circuit 732 can provide an error detection indication (ERROR) to compare circuit 728.

Compare circuit 728 can receive error detection indications (ERROR) to track an error rate of a given block. If an error rate exceeds some limit, a compare circuit 728 can activate control signals (HEAL (BLKx)) to initiate a heal operation on the block (which can include transferring data from the block to be healed).

As noted above, heal operations can include the application of heal electrical conditions to memory elements of a worn block. Heal electrical conditions can include establishing voltage/current conditions across elements to reverse wear effects. Such electrical conditions can be applied according to a predetermined algorithm with a sequence of pulses. In some embodiments, heal electrical conditions can be applied to memory elements of a block without regard to the actual state (e.g., performance) of the elements. However, in other embodiments, heal conditions can be applied based on memory element states. One such embodiment is shown in FIGS. 8A and 8B.

Figure 8A:
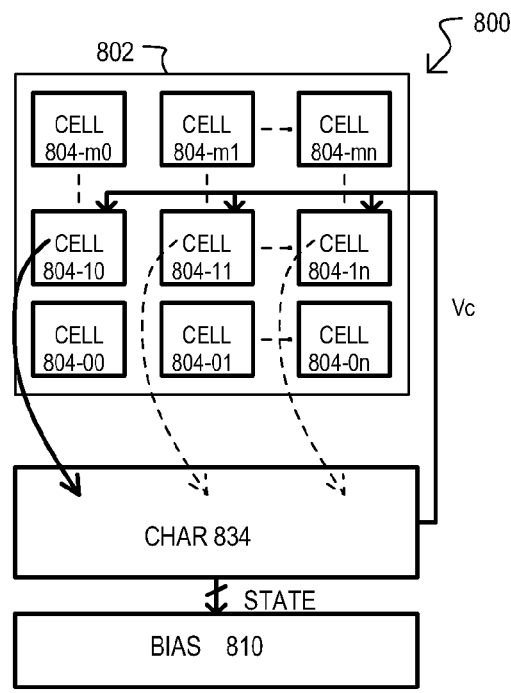
FIGS. 8A and 8B are block schematic diagrams of a memory device that can vary heal conditions based on characteristics of memory cell(s), according to an embodiment.
Figure 8B:
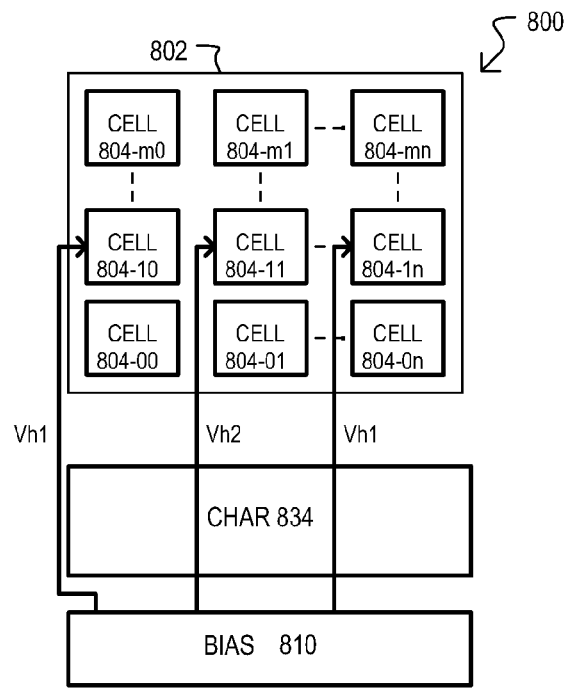

FIGS. 8A and 8B show a memory device 800 that can include multiple blocks (one shown as 802), a characterization section 834, and a bias section 810. A block 802 can include a number of memory cells 804-00 to -mn, each having one or more elements that can degrade due to wear.

A characterization section 834 can evaluate memory elements in blocks (802), and provide state data (STATE) to indicate how such elements are performing. In some embodiments, state data (STATE) can be an impedance state of a memory element (i.e., the data value it stores). However, in other embodiments, state data (STATE) can represent a more detailed characterization of a memory element, including but not limited to: a dynamic response to read conditions, responses to varying write conditions, or programmable impedance range. It is understood that a characterization section 834 can characterize all elements of a block 802, a sub-set of the elements, and/or one element (e.g., a reference element).

A bias section 810 can apply heal conditions that can vary according to state data (STATE) provided by characterization section 834.

FIG. 8A shows one part of a heal operation. Characterization conditions (Vc) can be applied to memory cells. In response, characterization section 834 can output state data (STATE) to bias section 834. In the particular embodiment shown, characterization conditions (Vc) can be applied to a row of memory cells (802-10 to -1n). However, as noted above, in other embodiments, fewer or greater numbers of memory cells can be characterized.

FIG. 8B shows the application of varying heal electrical conditions (Vh1, Vh2) to memory cells (802-10 to -1n) in response to state data (STATE).

While embodiments can substitute spare blocks for worn blocks based on an indicated wear level, other embodiments can automatically make such substitutions based on operations of a memory device. FIGS. 9A to 9D show one example of such an embodiment.

FIGS. 9A to 9D are a sequence of block schematic diagrams showing a memory device 900 having a number of physical blocks 902-0 to -8, an address translator 940, a count register 936, a gap register 938, and a bias section 910. Physical blocks (902-0 to -8) can include memory cells with one or more elements that can be subject to wear, as described herein or equivalents. In the embodiment shown, at any given time, eight blocks can be active, while one block is a spare block (which can be healed).

An address translator 940 can receive logical addresses, and translate them into physical addresses for accessing physical blocks 902-0 to -7. At any given time, an address translator 940 can enable access to eight physical blocks, while preventing access to any spare block(s).

A memory device 900 can assign a physical block as a spare block according to a predetermined order. Once all blocks have served at a spare block, the memory device 900 can return to the first block and repeat the sequence. A count register 936 can track how many times every block (902-0 to -8) has served as a spare block. A gap register 938 can indicate which block is currently a spare block. Bias section 910 can apply various electrical conditions to the blocks (902-0 to -8) including heal electrical conditions.

FIG. 9A shows a memory device 900 in an initial state. Blocks 902-0 to -7 can be active, while block 902-8 can be inactive (not accessible for reads/writes due to address mapping). Count register 936 can indicate all blocks have not served as a spare block (ROUND=0). Gap register 938 can indicate that block 902-8 is the spare block.

In the embodiment shown, it is assumed that memory device 900 automatically swaps an active and spare block after certain conditions have been met. Such conditions can include, but are not limited to: the execution of a certain number of operations, such as write operations, the passage of a predetermined amount of time, or combinations thereof.

FIG. 9B shows a memory device 900 following a first swapping between an active and spare block. Data previous stored in block 902-7 has been transferred to (previously spare) block 902-8, and block 902-7 is now a spare block. Count register 936 can continue to indicate ROUND=0, as only two of eight blocks have served as spares. Gap register 938 can indicate that block 902-7 is the spare block. Because block 902-7 is newly changed to a spare block, bias section 910 can apply heal electrical conditions (Vh) to the spare block 902-7. Arrows from address translator 940 show how addresses previously directed to block 902-7 are now directed to block 902-8.

FIG. 9C shows a memory device 900 following an eighth swapping between an active and spare block. Data previously stored in block 902-0 has been transferred to (previously spare) block 902-1, and block 902-0 is now a spare block. Count register 936 can now indicate ROUND=1, as all blocks have now served as spare blocks once. Gap register 938 can indicate that block 902-0 is the spare block. As in the case of FIG. 9C, because block 902-0 is newly changed to a spare block, bias section 910 can apply heal electrical conditions (Vh) to the spare block 902-0. Arrows from address translator 940 show how addresses previously directed to blocks 902-0 to -7 are now directed to blocks 902-1 to -8, respectively.

FIG. 9D shows a memory device 900 after a gap register "rolls over", returning once again to point to block 902-8 (GAP=8), as in FIG. 9A. Data previously stored in block 902-8 has been transferred to (previously spare) block 902-0. Count register 936 continues to indicate ROUND=1. Because block 902-8 is newly changed to a spare block, bias section 910 can apply heal electrical conditions (Vh) to the spare block 902-8. Arrows from address translator 940 show how addresses previously directed to block 902-8 are now directed to block 902-0.

It is understood that FIGS. 9A to 9D show but one embodiment for automatically swapping active and spare blocks, and healing the new spare block.

Figure 10:
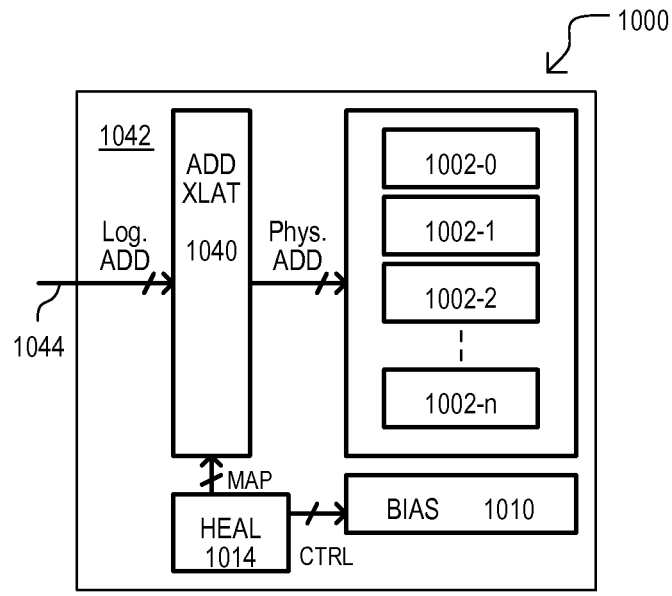
FIG. 10 is a block schematic diagram of a memory device that executes heal operations in an "invisible" manner, according to an embodiment.

Referring now to FIG. 10, memory device 1000 according to a further embodiment is shown in a block schematic diagram. Memory device 1000 can include blocks 1002-0 to -n, a bias section 1010, a heal section 1014, and an address translator 1040. Blocks (1002-0 to -n) can include memory cells with one or more elements that can be subject to wear, as described herein, or equivalents. Blocks (1002-0 to -n) can be accessible by application of physical address signals Phys. ADD.

An address translator 1040 can translate received logical addresses (Log. ADD) into physical addresses (Phys. ADD) based on control signals MAP. In this way, a memory device 1000 can re-direct accesses when a spare block replaces an active block.

A bias section 1010 can apply heal electrical conditions to a spare block, as described herein or equivalents. In the embodiment shown, in response to control signals CTRL, a bias section 1010 can apply heal conditions to one of the blocks (1002-0 to -n).

A heal section 1014 can generate signals MAP and CTRL to control heal operations. A heal section 1014 can operate in the manner described herein, or equivalents, swapping an active block for a spare block in response to wear data, or automatically, based on some condition (e.g., number of writes).

In the embodiment shown, an address translator 1040 and blocks (1002-0 to -n) can be formed in a same integrated circuit (IC) device 1042. That is, an address translator 1040 and blocks (1002-0 to -n) can be formed in a same substrate or in a same IC package. Thus, logical address inputs (Log. ADD) are received on IC inputs 1044. Accordingly, heal operations can occur "invisibly" or "in the background" of the operation of the IC device 1042. That is, a device issuing logical addresses (Log. ADD) to memory device 1000 is unaware swapping and healing is occurring on physical blocks.

In other embodiments, a memory device 1000 can be an embedded memory formed in a larger IC device, such as a system-on-chip.

Figure 11:
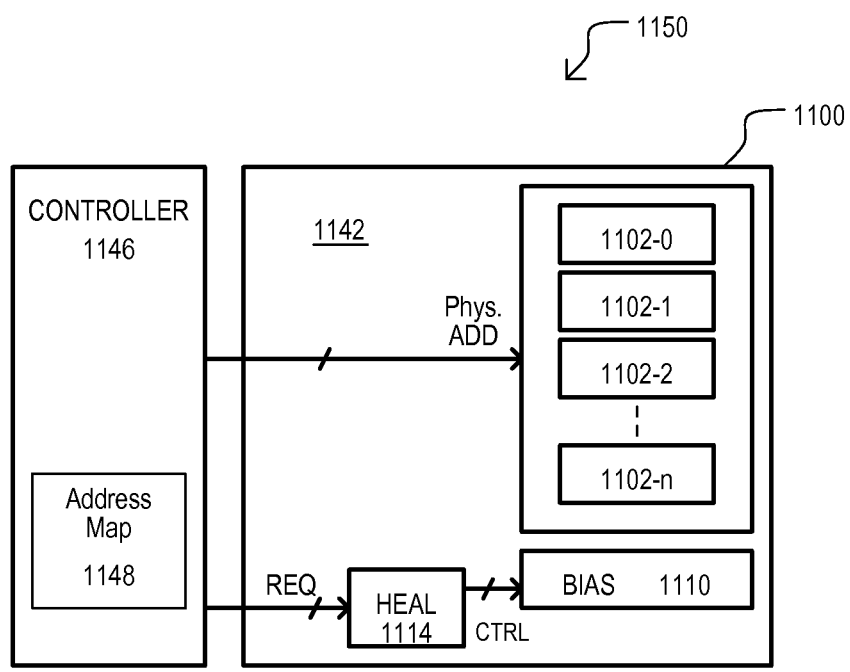
FIG. 11 is a block schematic diagram of a system in which a controller can translate addresses and/or initiate heal operations, according to an embodiment.

Referring now to FIG. 11, a system 1150 according to an embodiment is shown in a block schematic diagram. System 1150 shows an embodiment in which heal operations and address translations (for swapping active blocks with spare blocks) are performed by a device separate from an IC device containing the memory elements. A system 1100 can include a memory device 1100 and a controller 1146. A memory device 1100 can include sections like those of FIG. 10. However, unlike FIG. 10, memory device 1100 does not include an address translator (like that shown as 1040 in FIG. 10). Further, a heal section 1114 can receive requests (REQ) from controller 1146.

A controller 1146 can include an address mapping section 1148, which can track which regions of an address space (e.g., which blocks) are active, and which block(s) are spare blocks. Further, in the particular embodiment shown, controller 1146 can control heal operations to particular blocks by application of requests (REQ) to heal section 1144.

In some embodiments, a controller 1146 can be a memory controller for a memory sub-system, and can control multiple memory devices, like that shown as 1100. In particular embodiments, a controller 1146 can serve as a translation layer between logical addresses of a larger system, and the physical addresses of memory device(s) 1100. A controller 1146 can implemented with logic, including a processor that executes instructions.

Embodiments above have shown memory devices in which heal electrical conditions can be based on wear limits for blocks. It is noted that in some embodiments wear limits can vary between different blocks. As but one example, in some embodiments, one or more blocks could store data that is more critical to a system than data in other blocks. In such an embodiment, the data block storing more critical data can undergo heal operations more frequently (or at lower wear limits) than other blocks. One such embodiment is shown in FIG. 12.

Figure 12:
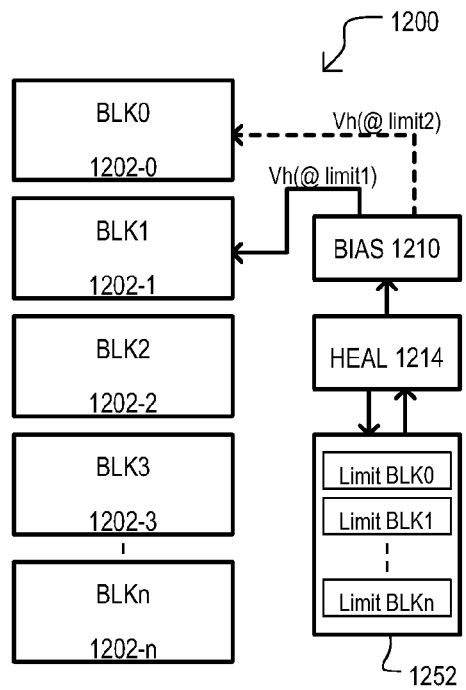
FIG. 12 is a block schematic of a memory device having blocks with different heal thresholds/conditions, according to embodiments.

FIG. 12 is a block schematic diagram showing a memory device 1200 according to another embodiment. A memory device 1200 can include blocks 1202-0 to -n, a heal section 1214, a bias section 1210, and a limit store 1252. Blocks (1202-0 to -n) can include memory cells with one or more elements that can be subject to wear, as described herein, or equivalents.

In response to control signals from heal section 1214, bias section 1210, can apply heal electrical conditions to blocks (1202-0 to -n) as described herein, or equivalents.

A heal section 1214 can initiate heal operations based wear limits provided by limit store 1252, which can vary from block to block. Accordingly, wear levels that could trigger a heal operation for one block may not be sufficient to trigger a heal operation for another block. In addition or alternatively, a heal section 1214 may automatically initiate block swaps and heal operations at different rates for different groups of blocks. As but one example, blocks (1202-0 to -n) could be divided into two groups, with each group including at least one spare block. A heal section 1214 can swap between an active and spare block of one group at a faster rate (e.g., fewer number of write operations) than the other group.

Embodiments above have shown devices and methods according to various embodiments. Additional method embodiments will now be described with reference flow diagrams in FIGS. 13 and 14.

Figure 13:
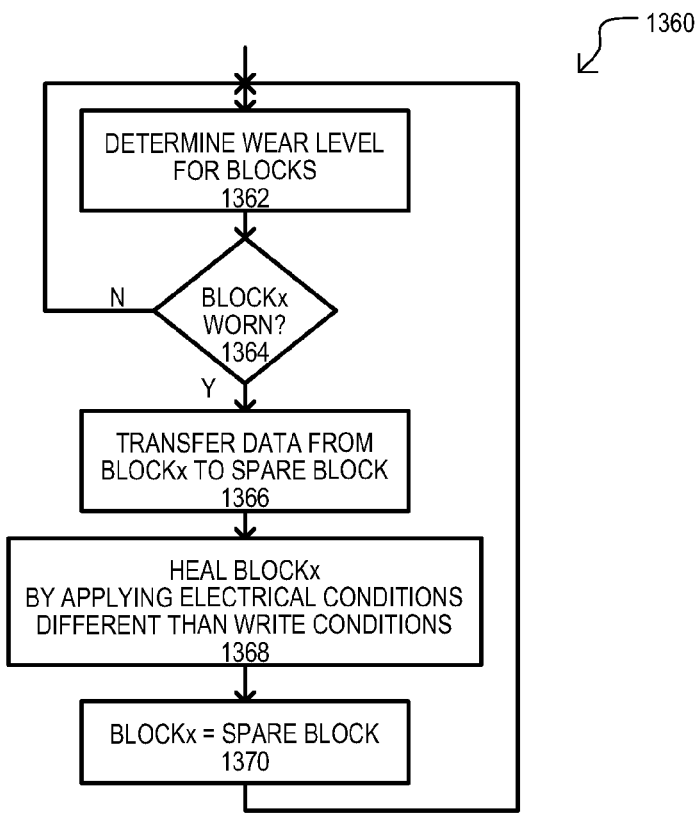
FIG. 13 is a flow diagram of a method according to an embodiment.

FIG. 13 is a flow diagram showing a method 1360 according to one embodiment. A method 1360 can determine wear levels for blocks (1362). Such an action can include tracking accesses to particular blocks, including tracking accesses of particular types, such as writes, or writes of a particular value (e.g., programs, erases). In addition or alternatively, such an action can include simply counting a number of accesses to a device, and then designating a worn block according to some order (e.g., such as in FIGS. 9A to 9D).

If a block is not considered worn (N from 1364), a method can return to determining if a block is worn. If a block (BLOCKx) is considered worn (Y from 1364), data can be transferred from the worn block to a spare block (1366).

Heal electrical conditions can be applied to the block (from which data was transferred), where such conditions are different than write conditions (1368). As noted above, heal conditions can reverse wear on memory elements in a block, as described or equivalents.

A (now healed block) can be designated as a spare block (1370). Such a spare block can then be substituted for a next worn block.

Figure 14:
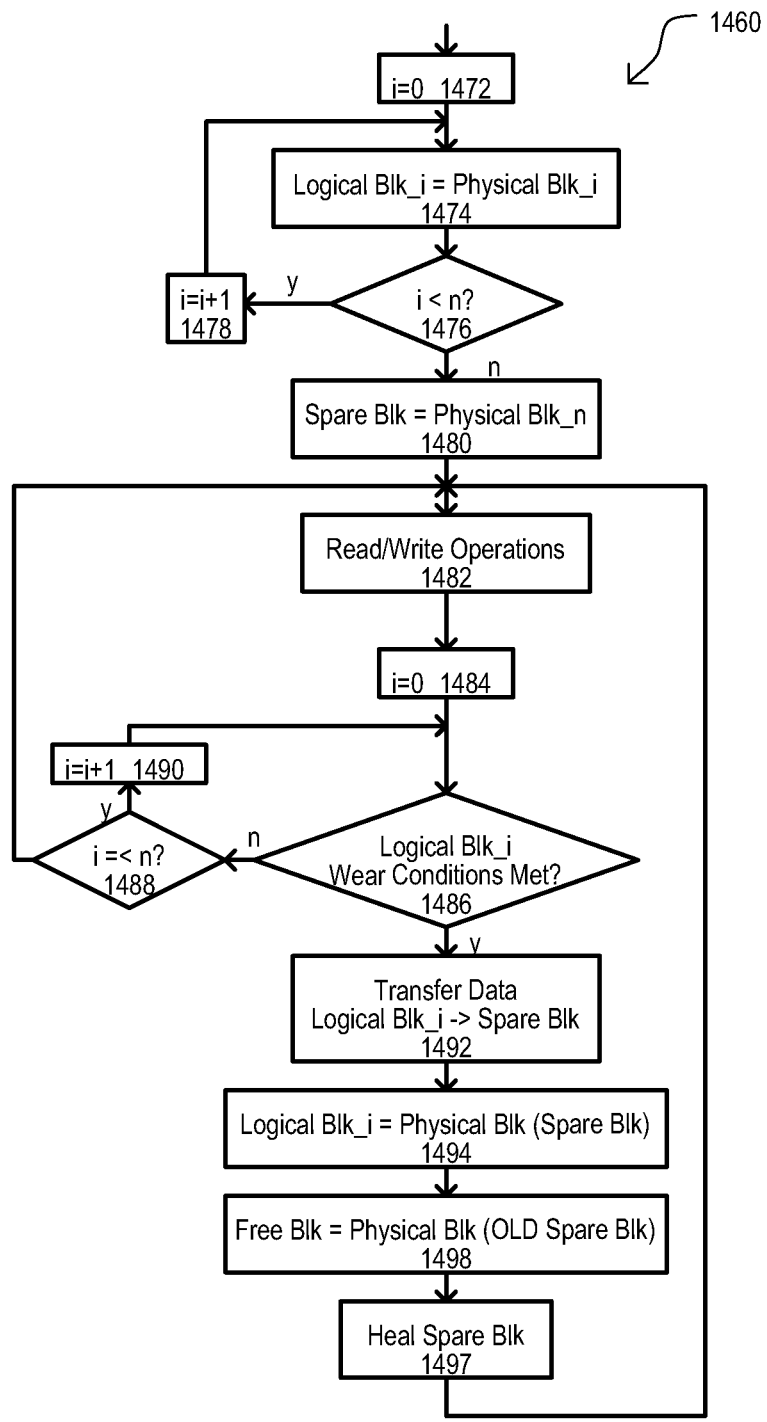
FIG. 14 is a flow diagram of a method according to another embodiment.

FIG. 14 is a flow diagram showing a method 1460 according to another embodiment. A method 1460 can assign "n" logical block values to "n+1" physical block values (1472, 1474, 1476, 1478). One of the physical blocks can be designated as a spare block. In the embodiment shown, physical block "n" can be an initial spare block (1480). The physical blocks corresponding to the n logical blocks can be active blocks.

A method 1460 can perform read and write operations (1482). Such an action can include accessing the "n" physical blocks based on logical assignment. The spare physical block(s) is excluded from a standard data read and write space.

A method 1460 can then determine if any active blocks are worn. In the embodiment shown, a method 1460 can cycle through the logical blocks (which will not include any spare block(s)), determining if wear conditions are met for each logical block (1484, 1486, 1488, 1490). If no logical blocks are determined to be worn (n from 1486), a method can return to read and write operations (1482).

If a logical block is determined to be worn (y from 1486), a method can transfer data from the worn logical block to a spare physical block (1492). The logical identification of the spare block can then be switched to that of the worn logical block (1494). The worn block can be designated as a spare block (1498). The spare block can then be healed (1497). Healing can include the application of healing electrical conditions as described herein, or equivalents.

As noted above, healing operations can occur on a "block" basis, where a block is some division of memory cells in a memory device.

Figure 15A:
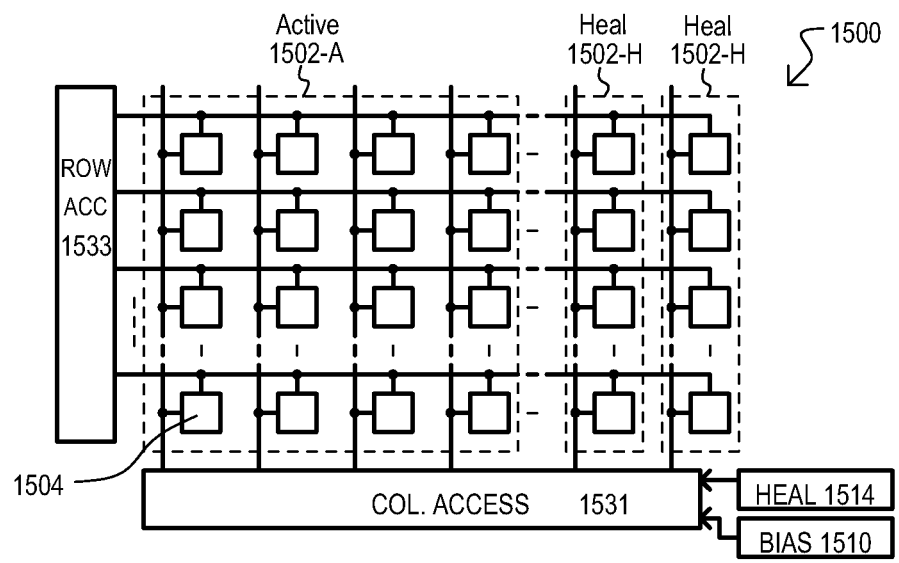
FIGS. 15A and 15B are block schematic diagrams of a memory device that can heal memory cells on a column-wise basis, according to one embodiment.

FIGS. 15A/B show a memory device 1500 according to one embodiment, where healing operations can occur on a column-wise basis. A memory device 1500 can include memory cells (one shown as 1504) arranged into rows and columns, a row access circuit 1533, a column access circuit 1531, a heal section 1514, and a bias section 1510.

Figure 15B:
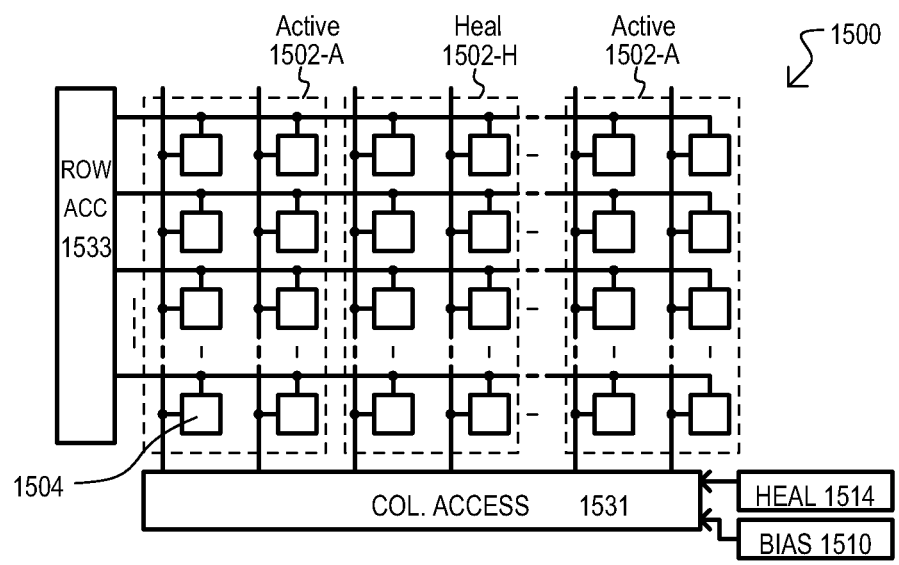

FIGS. 15A and 15B show the operation of memory device as columns are rotated in and out of healing operations. Columns undergoing healing operations are shown as 1502-H, while active columns are shown as 1502-A. A heal section 1514 can apply healing bias conditions from bias section 1510 to columns 1502-H, while active columns 1502-A are available to store data values.

Figure 16A:
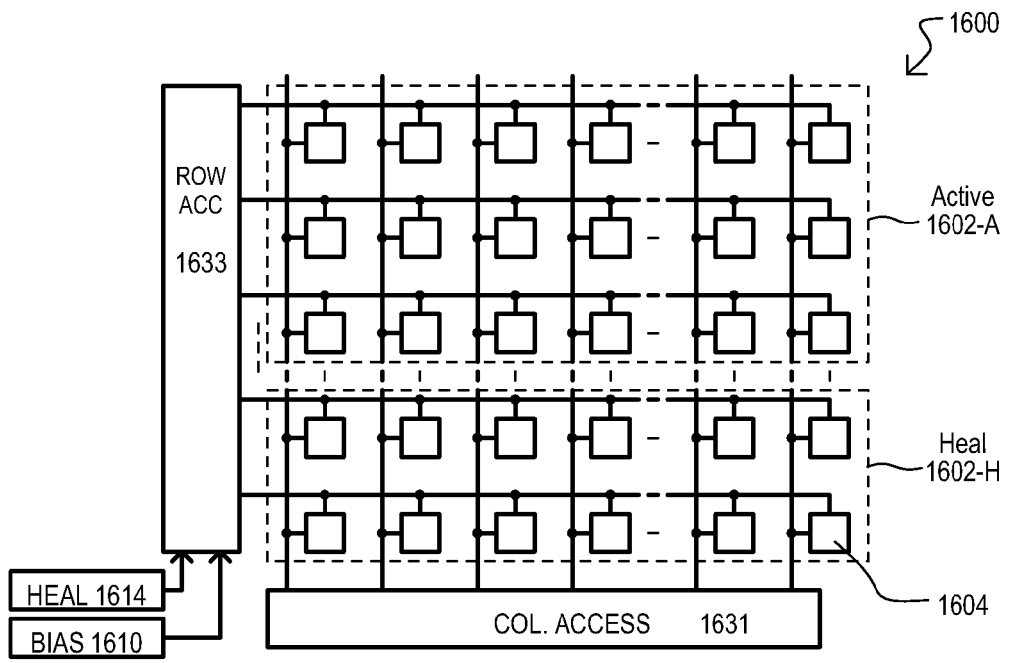
FIGS. 16A and 16B are block schematic diagrams of a memory device that can heal memory cells on a row-wise basis, according to one embodiment.

FIGS. 16A/B show a memory device 1600 according to another embodiment, where healing operations can occur on a row-wise basis. A memory device 1600 can include sections like those of FIGS. 15A/B, with memory cells (e.g., 1604) arranged into multiple rows.

Figure 16B:
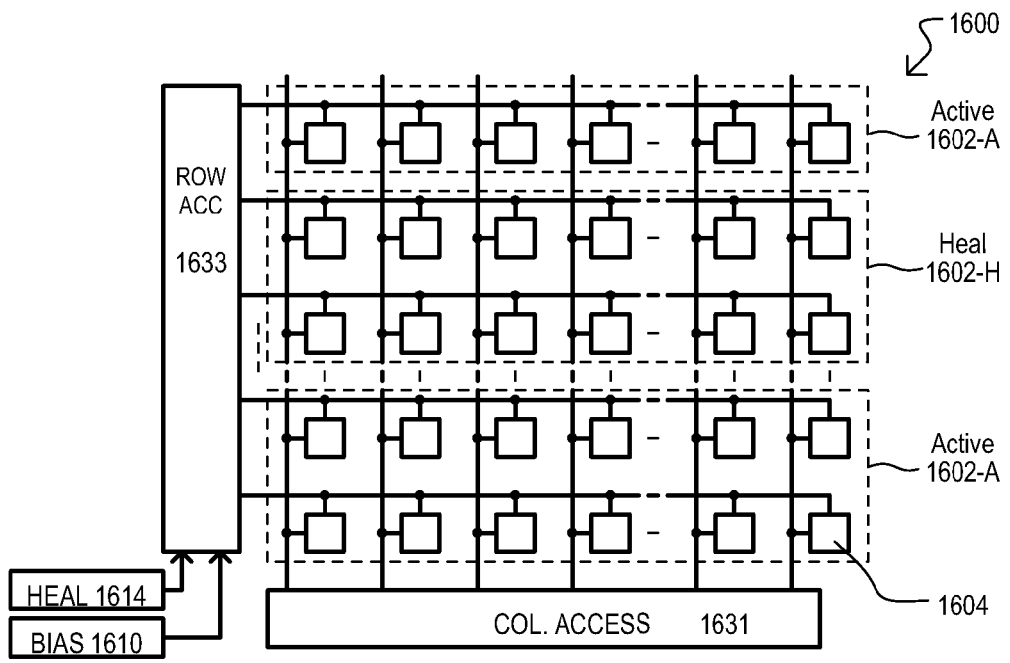

FIGS. 16A and 16B show the operation of memory device as rows are rotated in and out of healing operations. Rows undergoing healing operations are shown as 1602-H, while active rows are shown as 1602-A. A heal section 1614 can apply healing bias conditions from bias section 1610 to healing rows 1602-H, while active rows 1602-A are available to store data values.

Figure 17:
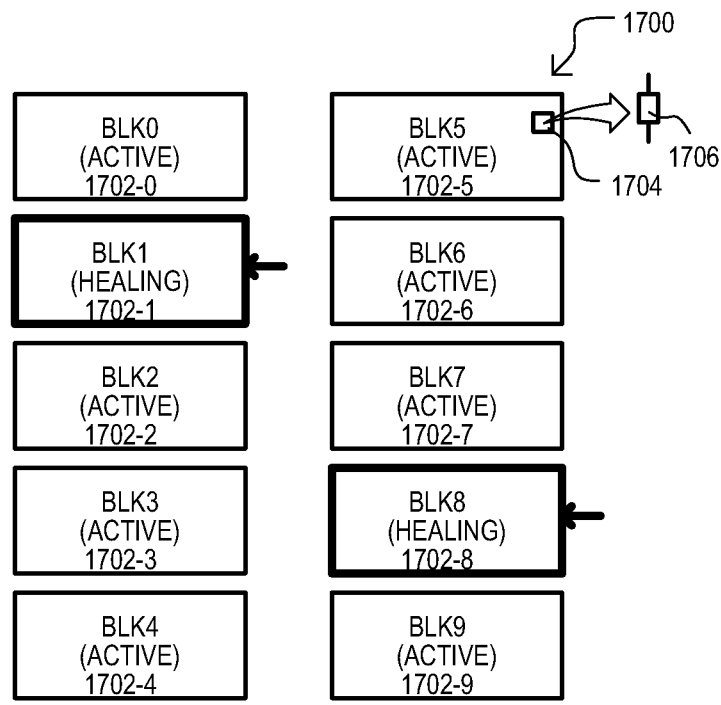
FIG. 17 is a block schematic diagram of a memory device having more than one spare block for healing, according to an embodiment.

FIG. 17 shows a memory device 1700 having more than one spare block for healing. FIG. 17 shows features like those of FIGS. 1A to 1C, but shows ten blocks 1702-0 to -9, two of which can be spare blocks to enable healing.

It is also understood that the number of spare blocks for healing can be programmable, enabling a healing to occur at different rates according to application.

As noted above, embodiments can provide more than one set of healing conditions for a group of memory cells. In one particular embodiment, such various healing conditions can enable heal operations to occur at different speeds and/or different degrees of healing (i.e., one type of healing allows memory cells to operate longer before wear than another type of healing).

Figure 18:
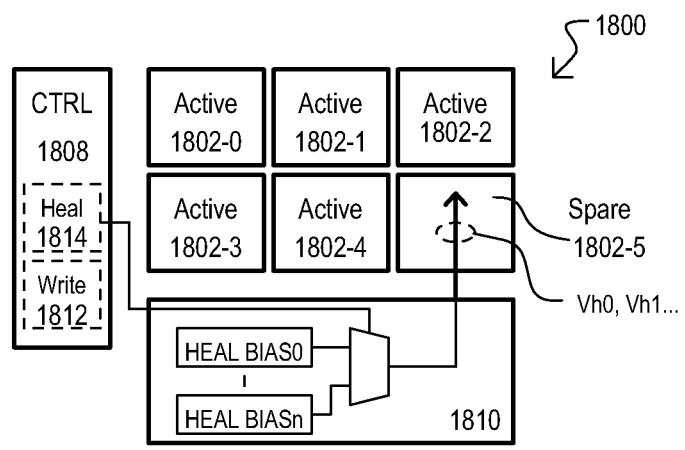
FIG. 18 is a block schematic diagram of a memory device that can apply more than one type of healing operation to a block, according to an embodiment.

FIG. 18 shows a memory device 1800 according to one particular embodiment. A memory device 1800 can include sections like those of FIGS. 3A to 3C. A bias section 1810 can include multiple heal bias sources (HEAL BIAS0 to HEAL BIASn), each of which can provide different heal conditions. By operation of heal section 1814, one of multiple heal conditions can be applied to a spare block (1802-5), taken out of rotation from active blocks 1802-0 to -4.

While embodiments have been described that include CBRAM type elements, other embodiments can include different types of memory elements, including phase change memory (PCM) type elements, magnetoresistive RAM (MRAM) type elements, ferroelectric RAM (FRAM) type elements.

While embodiments have been described that include particular algorithms for determining a worn block (i.e., a block selected for healing), such embodiments should not be construed as limiting. Any suitable block selection method for wear leveling can be included in the embodiments, but with the application of healing to a spare block.

Embodiments employing wear healing as described herein, and equivalents, can extend the overall endurance of a memory device, improve data retention of elements within a memory device, and/or increase the reliability of a memory device.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
    a plurality of physical blocks that each include a number of memory elements programmable between at least two different impedance states, the memory elements being subject to degradation in performance; and
    bias circuits configured to applying healing electrical conditions to at least one spare physical block that does not contain valid data; wherein
    the healing electrical conditions are different from write operation electrical conditions, and reverse degradation of the memory elements of the at least one spare physical block.

2. The memory device of claim 1, wherein:
    the memory elements comprise a programmable resistance material formed between two electrodes.

3. The memory device of claim 2, wherein:
    the memory elements each comprise a solid state electrolyte in which conductive regions can be formed and dissolved.

4. The memory device of claim 1, further including:
a wear circuit configured to generate a heal indication for a physical block in response to predetermined wear conditions; and
the bias circuits apply the healing electrical conditions to the physical block in response to at least the heal indication.

5. The memory device of claim 4, wherein:
the wear circuit is coupled to receive write request data, and includes a wear level store circuit to store wear level data for each physical block; wherein
the heal indication is generated in response to the wear level data for the physical blocks.

6. The memory device of claim 4, wherein:
the wear circuit includes a characterization circuit that applies characterization conditions to at least one element of the physical block to generate state data; and
the heal indication is generated in response to the state data.

7. The memory device of claim 1, wherein:
each physical block comprises a plurality of memory cells, each cell include
an access device coupled to a bit line common to a column of memory cells, and a word line common to a row of memory cells, and
at least one of the memory elements.

8. A system, comprising:
a plurality of memory blocks, each including a plurality of memory cells having at least one element programmable between impedance states, the memory blocks including active blocks and at least one spare block;
an address translation circuit configured to substitute accesses to one memory block for accesses to another memory block; and
a bias circuit configured to applying healing electrical conditions to the spare block; wherein
the healing electrical conditions are different from write conditions that write data to the memory cells and different from read conditions that read data from the memory cells, and reverse wear conditions of memory elements in the spare block.

9. The system of claim 8, wherein:
the memory elements are two terminal elements programmable to form and dissolve a conductive path though at least one memory layer.

10. The system of claim 8, wherein:
the memory blocks and address translation circuit are formed in a same integrated circuit (IC), and the address translation circuit translates address values received from a source external to the IC into physical addresses that access the memory blocks.

11. The system of claim 8, wherein:
the memory blocks are formed in one integrated circuit (IC); and
the address translation circuit is formed in another IC.

12. The system of claim 8, wherein:
a control circuit configured to transfer data from one memory block to the spare block and designate the one memory block as the new spare block.

13. The system of claim 8, further including:
the memory blocks and bias circuit are formed in a same integrated circuit (IC);
a control circuit formed in the IC configured to generate heal control signals; and
the bias circuit is configured to apply the healing electrical conditions in response to the heal control signals.

14. The system of claim 8, wherein:
the memory blocks and bias circuit are formed in a same integrated circuit (IC); and
the bias circuit is configured to apply the healing electrical conditions in response to commands received by the IC.

15. A method, comprising:
determining a wear status of each of a plurality of blocks, each block including a plurality of memory cells having at least one element programmable between impedance states;
if a block is determined to be worn, transferring data from the one block to a spare block; and
applying healing electrical conditions to the one block that reverse degradation of the memory elements of the worn block.

16. The method of claim 15, wherein:
determining the wear status includes storing a wear value for each block that corresponding to the number of times the block has been subject to at least one type of access operation.

17. The method of claim 15, wherein:
the healing electrical conditions are different from write conditions that write data into the cells.

18. The method of claim 15, further including:
designating the one block as a new spare block for receiving data from a next block determined to be worn.

19. The method of claim 15, further including:
after transferring data from the one block to the spare block, accessing the spare block with logical addresses previously used to access the one block.

20. The method of claim 15, wherein:
translating received logical addresses into physical addresses to access less than all of the blocks.

* * * * *